(12) United States Patent
Weng

(10) Patent No.: US 10,050,642 B2
(45) Date of Patent: Aug. 14, 2018

(54) LOW POWER SCHEME FOR BIT FLIPPING LOW DENSITY PARITY CHECK DECODER

(71) Applicant: Silicon Motion Inc., Hsinchu County (TW)

(72) Inventor: Chen-Yu Weng, Kaohsiung (TW)

(73) Assignee: Silicon Motion Inc., Hsinchu County (TW)

( * ) Notice: Subject to any disclaimer, the term of this patent is extended or adjusted under 35 U.S.C. 154(b) by 0 days.

(21) Appl. No.: 15/073,606

(22) Filed: Mar. 17, 2016

(65) Prior Publication Data

US 2017/0272097 A1 Sep. 21, 2017

(51) Int. Cl.
*H03M 13/00* (2006.01)
*H03M 13/11* (2006.01)

(52) U.S. Cl.
CPC .... *H03M 13/1108* (2013.01); *H03M 13/1111* (2013.01)

(58) Field of Classification Search
None
See application file for complete search history.

(56) References Cited

U.S. PATENT DOCUMENTS

| 8,117,515 B2 | 2/2012 | Yang |
| 8,549,375 B2 | 10/2013 | Ueng |
| 9,106,265 B2 * | 8/2015 | Nicolas ................. H03M 13/27 |
| 2003/0104788 A1* | 6/2003 | Kim ....................... H03M 13/05 |
| | | 714/758 |

| 2009/0106620 A1* | 4/2009 | Yokokawa ......... H03M 13/1111 |
| | | 714/752 |
| 2009/0106621 A1* | 4/2009 | Yokokawa ......... H03M 13/1111 |
| | | 714/752 |
| 2009/0228771 A1* | 9/2009 | Shasha ................ H03M 13/033 |
| | | 714/801 |

FOREIGN PATENT DOCUMENTS

| CN | 101902641 B | 4/2014 |
| KR | 101296773 B1 | 8/2013 |
| TW | 201119247 A1 | 6/2011 |

OTHER PUBLICATIONS

Chen et al., Reliability-Based Multibit-Flipping Decoding Algorithm for Low-Density Parity-Check Codes, Journal of China University of Science and Technology vol. 59-2014.04, p. 61-71, Apr. 2014.

* cited by examiner

*Primary Examiner* — Daniel McMahon
(74) *Attorney, Agent, or Firm* — Winston Hsu

(57) ABSTRACT

A method of power saving for a low-density parity check (LDPC) decoder includes: during each decoding iteration, determining a syndrome weight; and using the determined syndrome weight to set an optimal clock frequency for the LDPC decoding. The LDPC decoder applies hard decision decoding using a bit-flipping algorithm. When it is determined that the syndrome weights begin to overlap, the method further includes: performing one more iteration in hard decision hard decoding mode; providing a power boost to the LDPC decoder; and switching to hard decision soft decoding mode.

10 Claims, 2 Drawing Sheets

LOW POWER SCHEME FOR BIT FLIPPING LOW DENSITY PARITY CHECK DECODER

BACKGROUND OF THE INVENTION

1. Field of the Invention

This invention relates to low-density parity check decoding, and more particularly, to a low-density parity check decoder and decoding method which can save power.

2. Description of the Prior Art

Low-density parity check (LDPC) decoders use a linear error correcting code with parity bits. Parity bits provide a decoder with parity equations which can validate a received codeword. For example, a low-density parity check is a fixed length binary code wherein all the symbols added together will equal zero.

During encoding, all data bits are repeated and transmitted to encoders, wherein each encoder generates a parity symbol. Codewords are formed of k information digits and r check digits. If the length of the codeword is n then the information digits, k, will equal n−r. The codewords can be represented by a parity check matrix, which consists of r rows (representing equations) and n columns (representing digits), and is represented in FIG. 1. The codes are called low-density because the parity matrix will have very few '1's in comparison to the number of '0's. During decoding, each parity check is viewed as a single parity check code, and is then cross-checked with others. Decoding occurs at check nodes, and cross-checking occurs at variable nodes.

LDPC engines support three modes: hard decision hard decoding, soft decision hard decoding, and soft decision soft decoding. FIG. 1 illustrates the parity check matrix H and a Tanner graph, which is another way of representing the codewords, and is used to explain the operation of the LDPC decoder for hard decision soft decoding when using a bit flipping algorithm.

The check nodes, which are represented by the square boxes, are the number of parity bits; and the variable nodes, which are represented by the circular boxes, are the number of bits in a codeword. If a code symbol is involved in a particular equation, a line is drawn between the corresponding check node and variable node. 'Messages', which are estimates, are passed along the connecting lines, and combined in different ways at the nodes. Initially, the variable nodes will send an estimate to the check nodes on all connecting lines containing a bit believed to be correct. Each check node then takes all the other connected estimates, makes new estimates for each variable node based on this information, and passes the new estimate back to the variable nodes. The new estimate is based on the fact that the parity check equations force all variable nodes connected to a particular check node to sum to zero.

The variable nodes receive the new information and use a majority rule (a hard decision) to determine if the value of the original bit they sent was correct. If not, the original bit will be 'flipped'. The bit is then sent back to the check nodes, and these steps are repeated for a predetermined number of iterations or until the parity check equations at the check nodes are satisfied. If these equations are satisfied (i.e. the value calculated by the check nodes matches the value received from the variable nodes) then Early Termination can be activated, which allows the system to exit the decoding process before the maximum number of iterations is reached.

The parity check constraints are performed by doing a syndrome check. A valid codeword will satisfy the equation H. $C^T$=S=0, wherein H is the parity matrix, C is the hard decision codeword and S is the syndrome. When the syndrome equals zero, this means that no further information is required and the decoding process is complete. Typically, a hard decision and a syndrome check are performed during each iteration, wherein a non-zero syndrome means there is odd parity and a new decoding iteration is required.

Decoders have a power issue, wherein the more complicated they are, the more power they use. The above bit flipping algorithm can support both hard decision hard decoding and hard decision soft decoding modes. Hard decision hard decoding is the lowest power mode as it only involves 1 bit. As the number of error bits increases, however, the power issue starts to become more important. Above about 25 error bits, the throughput of the bit flipping algorithm starts to drop. Above about 40 error bits, it is better to switch to hard decision soft decoding, but the speed of the algorithm will be very unstable when a different mode is entered.

SUMMARY OF THE INVENTION

It is therefore an objective of the invention to examine when the power consumption is highest and change the clock frequency to minimize the tradeoff between power consumption and throughput.

A method of power saving for a low-density parity check (LDPC) decoder according to the present invention comprises: during each decoding iteration, determining a syndrome weight; and using the determined syndrome weight to set an optimal clock frequency for the LDPC decoding. The LDPC decoding is hard decision hard decoding using a bit-flipping algorithm. When it is determined that the syndrome weights begin to overlap, the method further comprises: performing one more iteration in hard decision hard decoding mode; providing a power boost to the LDPC decoder; and switching to hard decision soft decoding mode.

A related low-density parity check (LDPC) decoder comprises: a check syndrome weight circuit for determining a syndrome weight during each decoding iteration; a processor circuit, coupled to the check syndrome weight circuit, for controlling operations of the LDPC decoder; and an oscillator, coupled to the processor circuit, for providing a clock to the LDPC decoder, wherein the frequency of the clock is set according to the determined syndrome weight.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a frequency auto-tuning scheme in order to control power consumption vs. throughput issues.

As detailed in the background, bit-flipping can support all modes, but is best used for hard decision hard decoding which is a low power mode. Even in hard decision hard decoding, throughput drops above about 25 error bits. When hard decision soft decoding is entered, both bit-flipping and an N2 decoding engine can be used. Above 40 error bits, however, N2 is much more reliable. Therefore, a method is proposed which can provide a power boost via increasing clock frequency for bit-flipping during hard decision hard decoding, and can provide a further power boost when the mode changes to hard decision soft decoding.

Syndrome weight is used to determine an appropriate time for providing these clock frequency boosts. The syndrome weight is the number of non-zero components or unsatisfied check nodes in a trapping set (a subgraph of the Tanner graph of an LDPC code which causes decoder failure). As the syndrome weight will increase on average with the number of error bits, and the throughput of the BF engine also decreases as the errors increase, syndrome weight is a good indicator for when power boost is required.

In each iteration, the syndrome weight is first obtained, and a clock frequency is set accordingly. For a first iteration, a previous number of error bits can be obtained and used to set the initial clock frequency. During subsequent iterations, the syndrome weight is obtained each time, and used to maintain or increase the clock frequency. The aim is to maintain the throughput at approximately 400 MHz.

As the errors start to increase, the syndrome weight will begin to overlap during the bit flipping hard decision hard decoding mode. This is an indication that hard decision soft decoding mode needs to be entered. As detailed above, changing the mode requires a power boost, which means the clock frequency should be increased. In general, the bit flipping can go through one more iteration when it is detected that the syndrome weights begin to overlap before increasing the clock frequency and changing decoding modes.

The above method comprises two sub-methods. The first sub-method always returns to the initial clock frequency at the end of decoding, and then uses previous error bits to set the initial clock frequency for a next stage of decoding. The second sub-method maintains the latest clock frequency even when decoding is finished, and uses this clock frequency as the initial clock frequency for the next stage of decoding. The first sub-method can be termed an individual mode, and is better for decoding performance as the initial clock frequency is a better match for random data. The second sub-method can be termed a forward mode, and is better for power usage.

Figure 1:
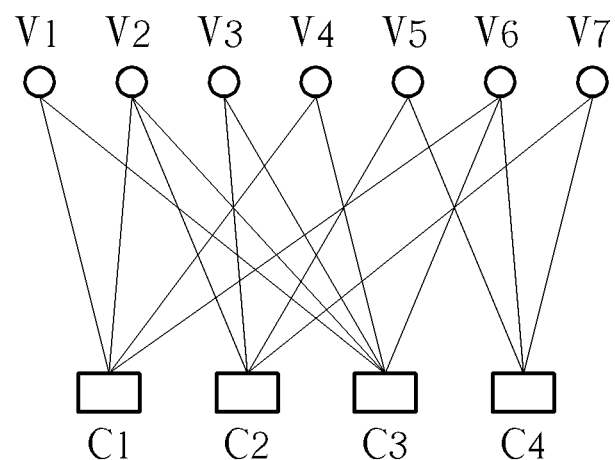
FIG. 1 is an illustration of a parity check matrix Tanner graph for low-density parity check decoding.
Figure 2:
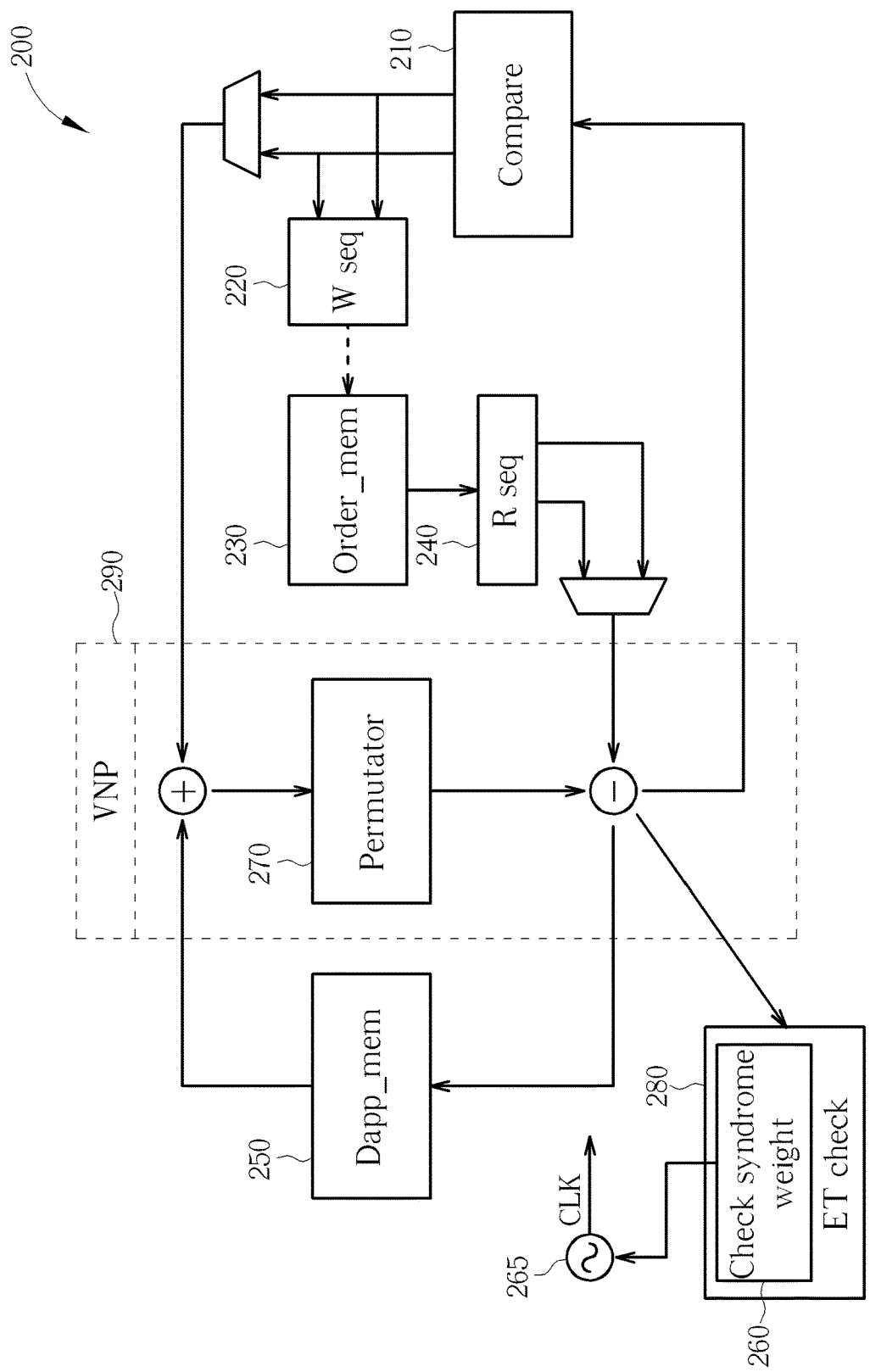
FIG. 2 is a diagram of an LDPC decoder according to an exemplary embodiment of the present invention.

Please refer to FIG. 2, which is a diagram of an LDPC decoding engine according to an exemplary embodiment of the present invention. The LDPC decoding engine 200 comprises an order memory 230 which stores channel values. The channel values and corresponding metrics are passed to a subtractor, and D values are sent to the compare circuit 210 for updating the channel values. The D values are also sent to the Dapp_memory 250, and are sent to a processor block 290, which outputs modified metrics. The modified channel values and metrics are combined at the adder to generate a new APP value, which is sent to the permutator 270 for activating a syndrome check via the Early Termination (ET) Check circuit 280. The ET Check circuit 280 also comprises a check syndrome weight circuit 260, which is coupled to an oscillator 265 that generates a clock frequency for the LDPC decoding engine 200. The check syndrome weight circuit 260 is used for determining the syndrome weight and using the syndrome weight to update the clock frequency. A signal is output from the check syndrome weight circuit 260 to the oscillator 265, which generates an updated clock signal CLK with a frequency according to the syndrome weight.

The present invention therefore provides a method and apparatus for auto-tuning a clock frequency during both hard decision hard decoding and hard decision soft decoding to maintain throughput when a number of error bits increases. By monitoring the syndrome weight, the throughput vs. power consumption issue can be controlled, and a power boost can be provided when hard decision hard decoding mode switches to hard decision soft decoding in order to prevent unstable speed. In this way, power consumption can be controlled.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of power saving for a low-density parity check (LDPC) decoder, the method comprising:
    performing a plurality of decoding iterations to decode a received codeword, comprising:
        performing an initial decoding iteration at a first clock frequency;
        at the end of the initial decoding iteration, determining a syndrome weight indicating a number of error bits of the decoded codeword;
        using the determined syndrome weight to update the first clock frequency for a next decoding iteration of the plurality of decoding iterations, the updated clock frequency being the same as or higher than the first clock frequency;
        performing the next decoding iteration according to the updated clock frequency; and
        repeating these steps until a codeword is determined;
    wherein when the syndrome weight of a specific iteration of the plurality of iterations indicates a number of error bits of the decoded codeword has increased, the updated clock frequency will be increased accordingly in order to give a same throughput for a next decoding iteration as for the specific iteration.

2. The method of claim 1, wherein in the initial iteration, the first clock frequency is set according to a number of error bits in an immediately previous decoding operation.

3. The method of claim 1, wherein the LDPC decoder applies hard decision decoding using a bit-flipping algorithm.

4. The method of claim 3, wherein when it is determined that the syndrome weights begin to overlap, the method further comprises:
    performing one more iteration in hard decision hard decoding mode;
    providing a power boost to the LDPC decoder by adjusting the clock frequency; and
    switching to hard decision soft decoding mode.

5. The method of claim 1, further comprising:
    in a next decoding operation, using a clock frequency used in a previous plurality of decoding iterations as the initial clock frequency.

6. A low-density parity check (LDPC) decoder for performing decoding operations comprising a plurality of decoding iterations to decode a received codeword, the LDPC decoder comprising:
    a check syndrome weight circuit for determining a syndrome weight indicating a number of error bits of the decoded codeword at the end of each decoding iteration of the plurality of decoding iterations;

a processor circuit, coupled to the check syndrome weight circuit, for controlling operations of the LDPC decoder; and an oscillator, coupled to the processor circuit, for providing a clock to the LDPC decoder, wherein an initial decoding iteration of the plurality of decoding iterations is performed at a first clock frequency of the clock, and the first clock frequency is updated according to the syndrome weight determined by the check syndrome weight circuit for a next decoding iteration of the plurality of decoding iterations, the updated clock frequency being the same as or higher than the first clock frequency;

wherein when the syndrome weight of a specific iteration of the plurality of iterations indicates a number of error bits of the decoded codeword has increased, the updated clock frequency will be increased accordingly in order to give a same throughput for a next decoding iteration as for the specific iteration.

7. The apparatus of claim 6, wherein in the initial iteration, the processor circuit sets the clock frequency according to a number of error bits in an immediately previous decoding operation.

8. The apparatus of claim 6, wherein the LDPC decoder applies hard decision decoding using a bit-flipping algorithm.

9. The apparatus of claim 8, wherein when the check syndrome weight circuit determines that the syndrome weights begin to overlap, the processor circuit instructs the LDPC decoder to perform one more iteration in hard decision hard decoding mode, then controls the oscillator to increase the frequency of the clock, and instructs the LDPC decoder to switch to hard decision soft decoding mode.

10. The apparatus of claim 6, wherein a clock frequency used in a previous plurality of decoding iterations is used as the initial clock frequency in a next decoding operation.

* * * * *